METHOD FOR BONDING A METAL PATTERN TO A SUBSTRATE

Filed July 16, 1970 2 Sheets-Sheet 1

INVENTORS
G. E. CROSBY
D. J. SHANEFIELD
BY W. L. Williamson
ATTORNEY

METHOD FOR BONDING A METAL PATTERN TO A SUBSTRATE

Filed July 16, 1970 2 Sheets-Sheet 2

United States Patent Office 3,679,472

Patented July 25, 1972

3,679,472

METHOD FOR BONDING A METAL PATTERN TO A SUBSTRATE

Gerald E. Crosby, Levittown, Pa., and Daniel J. Shanefield, Princeton, N.J., assignors to Western Electric Company, Incorporated, New York, N.Y.

Continuation-in-part of application Ser. No. 884,046, Dec. 15, 1969. This application July 16, 1970, Ser. No. 55,516

Int. Cl. B44d 1/18

U.S. Cl. 17—212 27 Claims

ABSTRACT OF THE DISCLOSURE

The bond between a metal film and a substrate is increased by employing an intermediate layer which effects a tenacious bond to the substrate. The propensity of such an intermediate layer to be extremely difficult, if not impossible, to etch without deleteriously damaging the film is eliminated by using a discontinuous intermediate layer. Electroplating of the metal film is facilitated by depositing a continuous conductive coating which can be etched without deleterious damage to the metal film onto the discontinuous intermediate layer.

CROSS-REFERENCE TO RELATED APPLICATION

This application is a continuation-in-part of application Ser. No. 884,046, filed Dec. 15, 1969.

BACKGROUND OF THE INVENTION

(1) Field of the invention

This invention relates to a method for manufacturing a circuit pattern on a substrate, and is particularly concerned with tenaciously bonding a circuit pattern to a ceramic substrate.

(2) Problems in the prior art

In the conventional production of a thin film or a thick film circuit pattern, the bonding of the circuit pattern to a suitable substrate may be facilitated by first depositing a thin, continuous, intermediate layer of a first material on the substrate and then depositing a thicker, second layer in the desired circuit pattern on selected portions of the intermediate layer, see for example, U.S. Pat. 3,306,830. The uncoated portions of the intermediate layer are then etched from the substrate. The circuit pattern is bonded to the substrate by the remaining underlying portions of the intermediate layer and constitute the finished circuit.

When employing the above technique, the intermediate layer serves to tenaciously bond the circuit pattern to the substrate and, when the intermediate layer is conductive, permits the circuit pattern to be electroplated onto the substrate. This is in contrast to the similarly well-known technique of direct deposition, wherein a coating is directly deposited on the substrate and then etched to form the pattern.

Using an intermediate layer has certain advantages over direct deposition. In direct deposition, the material which forms the circuit pattern must (1) be chemically inert to the substrate so that no reaction will occur between the two when put into use; (2) be physically compatible with the substrate so as to effect a bond therebetween; and (3) be etchable from the substrate when etching the desired circuit pattern. In addition, the material must possess the necessary electrical properties to form the circuit pattern. Also, as the substrate is nonconductive, it is not possible to electroplate the circuit pattern directly onto the substrate unless of course electroless deposition techniques are employed.

On the other hand, when an intermediate layer is employed, it is possible to directly electroplate the circuit pattern merely by employing a conductive intermediate layer. Also, it is only necessary for the intermediate layer to be chemically inert with respect to the substrate and the circuit pattern, to form a tenacious bond to the substrate and circuit pattern and to be etchable from the substrate. It is not necessary for the intermediate layer to have the stringent electrical properties required for the circuit pattern or for that matter to even be conductive unless conductivity is desired to permit electroplating of the circuit pattern.

Thus, the principal advantages of employing an intermediate layer are (1) the electrical properties of the metal for the intermediate layer are less critical than the properties of the material required for the circuit pattern; and (2) a wider range of metals can be employed for the circuit pattern than when the circuit pattern is directly deposited on the substrate.

It has been found, however, that when an intermediate layer is employed with certain nonconductive substrates, particularly ceramics, a serious two-fold problem arises. Certain metals (e.g., palladium) when used as the intermediate layer bond tenaciously to the substrate, but cannot be etched therefrom without deleterious damage to the circuit pattern. For example, when applying a continuous palladium layer to a ceramic substrate (e.g., aluminum oxide), an excellent bond is attained. However, after applying the circuit pattern (e.g., copper) thereover, the exposed palladium layer cannot be etched from the substrate without deleteriously damaging the copper layer.

On the other hand, certain other metals (e.g., gold) which can be etched from a ceramic substrate without deleterious damage to the circuit pattern will not form a lasting, tenacious bond with the substrate. For example, when conventionally applying a continuous gold layer to a ceramic substrate, a satisfactory initial bond is attained, and after applying the copper circuit pattern, the uncoated gold may be etched from the substrate without damage to the circuit pattern. However, when the finished circuit is used, in a short time the gold peels away from the substrate, thus deleteriously affecting the electrical properties of the circuit.

SUMMARY OF THE INVENTION

A general object of the present invention is to provide a new and improved method for forming a circuit pattern on a substrate.

A more specific object of the present invention is to provide a new and improved method for tenaciously bonding a circuit pattern to a substrate.

A further object of the present invention is to provide a new and improved article having a circuit pattern which is tenaciously bonded to a substrate.

The method of the present invention attains the above objects by employing a technique of first depositing a discontinuous layer of an etch resistant but tenaciously adhering metal on a substrate and then depositing a continuous layer of an etchable metal on the etch resistant layer. These two superposed metal layers form a composite intermediate layer which is tenaciously bonded to the ceramic substrate and is readily etched without deleterious damage to the circuit pattern.

For the purposes of this disclosure, an etch resistant layer is a layer which is extremely difficult to etch without deleterious damage to the circuit pattern. In other words, an etch resistant layer is a layer which requires such severe etch treatment that serious damage to the circuit pattern occurs. Conversely, an "etchable" layer is a layer which can be etched without deleterious damage to the circuit pattern. In other words, an etchable layer is a layer which can be etched with an etchant which will not deleteriously damage the circuit pattern. There are many materials which can be classified into either group, but for the purposes of this disclosure, palladium is illustratively classified as an etch resistant material and gold is illustratively classified as an etchable material. It is to be understood that suitable additional materials with equivalent properties may be included in each grouping. Also, it will be appreciated that a material can be classified as etch resistant even if it can be etched with a mild etchant and as etchable even if it can only be etched by a severe etchant. For example, if the material which can be etched with a mild etchant requires an etch time which will deleteriously damage the circuit pattern, then the material is etch resistant. On the other hand, if the material which can be etched only with a severe etchant requires a very short etch time which is insufficient to deleteriously damage the circuit pattern, then the material is etchable.

The key to the etchability of the above-mentioned composite intermediate layer is the discontinuity of the etch resistant first layer of metal deposited on the substrate. The discontinuous layer consists of a series of discrete islands separated by exposed parts of the underlying substrate. This discontinuous layer is further characterized by a relatively high electrical resistance. (Illustratively, the sheet resistance of the layer is in excess of one hundred ohms per square.) It has been surprisingly found that such a discontinuous layer of a material which is normally etch resistant on a ceramic substrate, though forming a tenacious bond in the same manner as a continuous layer, is as easily etchable from the substrate as an etchable material.

One practical way of distinguishing between a discontinuous layer and a continuous layer of the etch resistant material is to measure the sheet resistance. Generally, if the sheet resistance is equal to or less than one hundred ohms per square, a continuous layer is indicated and such a layer is found to be etch resistant. If the sheet resistance is higher than one hundred ohms per square, a discontinuous, or etchable layer is indicated.

In an illustrative form of the invention, a discontinuous layer of palladium is deposited on a nonconductive ceramic substrate (e.g., $Al_2O_3$) by immersing the substrate in a suitable palladium salt solution. A continuous gold layer is then deposited on the palladium layer, and the structure is then fired to sinter the gold and palladium to the substrate. As a result, a composite intermediate layer of gold and palladium is tenaciously bonded to the ceramic substrate. A circuit pattern (e.g., of copper) is then deposited on selected portions of the gold layer, and the exposed or uncoated portions of the gold and underlying discontinuous palladium are etched from the substrate to form the final structure.

BRIEF DESCRIPTION OF THE DRAWING

The aforementioned and other objects and features of the invention will be apparent from the following detailed description of specific embodiments thereof when read in conjunction with the accompanying drawing, in which.

DETAILED DESCRIPTION

In an illustrative form of the invention suitable for the production of circuit patterns for printed circuit applications and the like, the required circuit pattern is formed on an intermediate layer which (1) is tenaciously bonded to an underlying substrate (e.g., of alumina) and (2) is etchable therefrom. Such an intermediate layer that meets the joint requirements of bondability and etchability is a composite film which consists of a thin, discontinuous "first layer" of an etch resistant material (e.g., palladium) and a thicker continuous "second layer" of an etchable second material (e.g., gold).

Figure 1:
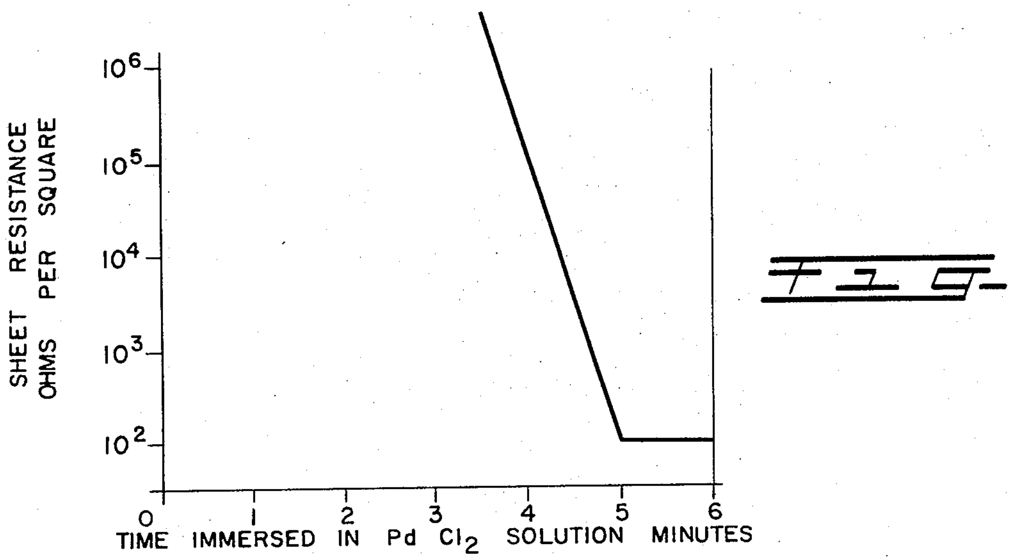
FIGS. 1–3 are graphs respectively illustrating variations in (1) the electrical sheet resistivity of a palladium coating on an aluminum oxide substrate, (2) the adhesion of the palladium coating to the substrate, and (3) the time required to etch the palladium coating from the substrate, each such variation being determined as a function of the time that the substrate had been immersed in a palladium solution to form the coating.
Figure 2:
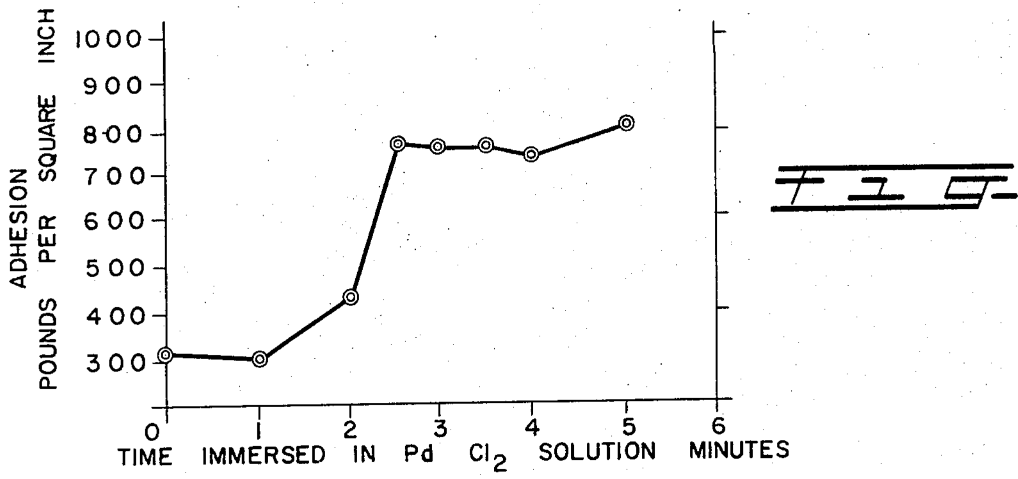
Figure 3:
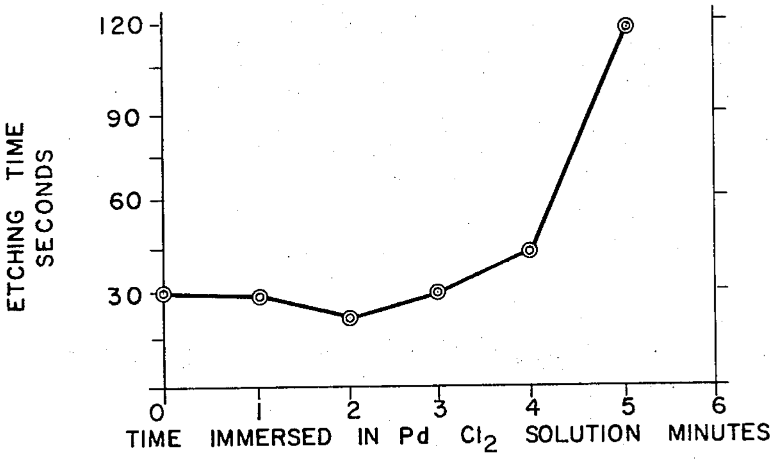

Referring now to the drawing, and more particularly to FIGS. 1–3, there are illustrated certain observable properties which help to distinguish a desired discontinuous layer of palladium deposited upon a substrate from a continuous layer of palladium deposited thereon. The data summarized by the graphs of FIGS. 1–3 were generated using a 0.01% aqueous solution of palladium chloride at room temperature. The substrates were first sensitized by immersing for three minutes in a 3% aqueous stannous chloride solution. Suitable ranges of immersion time to meet the needs of the present invention can be determined by evaluating the data presented in FIGS. 1–3. As will be appreciated by one skilled in the art, the immersion interval required to deposit a discontinous palladium layer on a substrate will vary with the particular solute, the concentration of the solution, the temperature, the substrate, etc. However, measuring the sheet resistivity of the palladium layer has been found to accurately reflect whether the palladium layer is continuous or discontinuous and can be conveniently employed to adjust the immersion time to the proper interval for the particular solute, solution concentration, temperature, substrate, etc., which is used.

In FIG. 1, the curve represents the electrical sheet resistance of a palladium layer on each of a typical series of alumina substrates which have been immersed in the 0.01% aqueous palladium chloride solution for different time intervals to form the intermediate layer. As shown by the curve, the layers formed on substrates which have been immersed in the solution for 3½ minutes have sheet resistance values greater than 1 megohm per square. Layers on substrates that have been immersed in the solution for 4 minutes have a much lower sheet resistance, approximately 0.1 megohm per square. The sheet resistance of films coated on substrates that have been immersed for 5 minutes and longer is less than 0.0001 megohm per square. It is postulated that the palladium layer becomes continuous when a sheet resistance of 0.0001 megohm or less is reached. By contrast, a bare alumina substrate normally has a resistivity exceeding 1 megohm per square.

FIG. 2 indicates the adhesion properties of a composite intermediate layer on an alumina substrate. The composite intermediate layer includes an underlying first layer of palladium (deposited by immersing a series of substrates at varying time intervals in the manner aforementioned) and an overlying second layer of gold which is approximately 2,500 angstroms thick, deposited essentially in the same manner disclosed in U.S. Pat. 3,207,838. The adhesion is determined by the force required to pull the composite intermediate layer away from the substrate.

The curve of FIG. 2 indicates that for substrate immersion times of 2 minutes or less, the force required to pull the composite intermediate layer from the substrate is relatively small in magnitude (i.e., approximately 300–450 p.s.i.). For periods of immersion greater than 2 minutes the pulling force increases markedly up to approximately 800 p.s.i. at 2½ minutes immersion. As the curve indicates, this maximum force remains essentially constant for immersion time up to 5 minutes. For purposes of this invention, a tenacious bond for the composite intermediate layer is achieved if the force required to pull the composite intermediate layer from the substrate exceeds 450 p.s.i.

The curve in FIG. 3 illustrates the etching time required to remove the composite intermediate layer from a substrate which has been immersed in the palladium chloride solution at varying time intervals to form the palladium constituent of the composite intermediate layer. The gold layer was approximately 2,500 angstroms thick. As indicated, for immersion periods up to 3 minutes the time required to etch the composite intermediate layer from the substrate utilizing a conventional etchant (e.g., a 73.6% aqueous solution of potassium tri-iodide) remains rather constant and takes approximately 30 seconds. The etch time increases to 45 seconds for a 4-minute immersion, and then increases rapidly to 2 minutes when the immersion time is increased to 5 minutes. For immersion periods greater of 5 minutes or more, the composite film cannot be etched from the substrate, without deleteriously destroying the circuit pattern.

It is seen from FIGS. 1–3 that a palladium layer which is suitable for the purposes of the invention (and which therefore possesses high adhesion strength properties, and etchability) may be produced when an alumina substrate is immersed in the 0.01% aqueous solution of palladium chloride for a time interval in excess of two minutes but less than five minutes. A time interval of from 2½ to 3½ minutes has been found to be particularly suitable.

When different parameters are employed to deposit the palladium (e.g., different palladium salt solutions, different solution concentrations, different temperatures, etc.), the required immersion interval can readily be determined by equating different immersion times to the sheet resistance of the alumina substrate. As the sheet resistance of the alumina substrate is normally in excess of one megohm per square, the shortest immersion time of the required immersion interval can be equated to the point just prior to sufficient palladium being deposited to begin to reduce the sheet resistance of the alumina substrate. The longest immersion time of the required immersion interval can be squated to the point where sufficient palladium is deposited to reduce the sheet resistance of the substrate to 100 ohms per square. The preferred immersion time can be equated to the deposition of sufficient palladium to reduce the sheet resistance to approximately one megohm per square.

Figure 4:
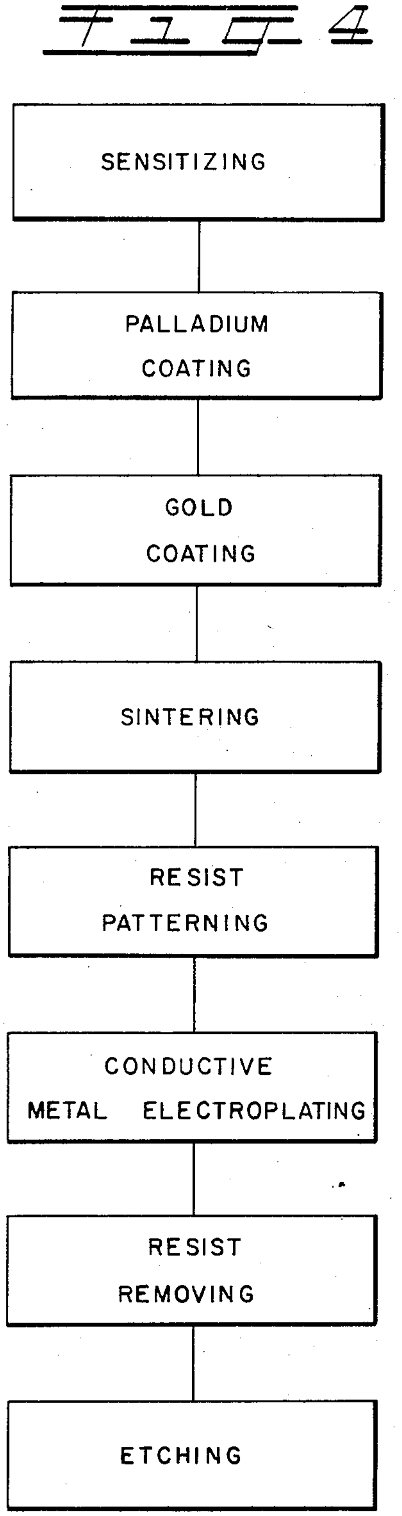
FIG. 4 is a flow chart which schematically illustrates an illustrative combination of operations in accordance with the method of the invention.

Referring now to FIG. 4, the illustrated flow chart depicts an illustrative sequence of steps in accordance with the invention for processing a substrate (illustratively of aluminum oxide) during the manufacture of a circuit pattern.

Figure 5:
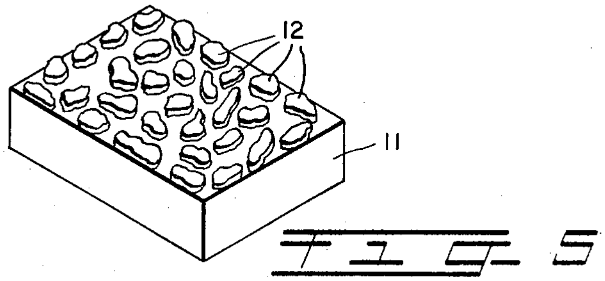
FIG. 5 is a perspective view illustrating an early stage in the processing of an article to be formed in accordance with the method of the invention.

The substrate is initially sensitized, for example, by immersion in a 3% aqueous solution of stannous chloride. The substrate is then immersed in a suitable aqueous solution of palladium chloride for a suitable period of time to form a discontinuous palladium coating, e.g., in a 0.01% aqueous solution of palladium chloride for a time interval in excess of 2 minutes but less than 5 minutes. The coated substrate is then rinsed and dried. At this point, as illustrated in FIG. 5, substrate 11 has a discontinuous palladium metal layer 12, i.e., a plurality of discrete islands of palladium.

Figure 6:
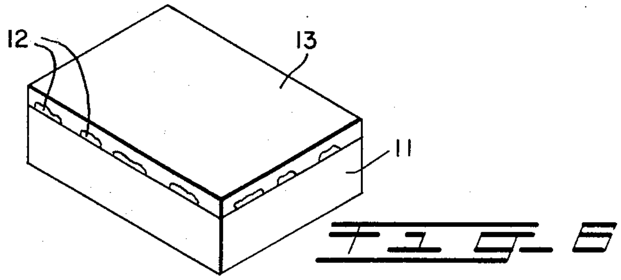
FIG. 6 is a similar view to that of FIG. 5, illustrating a later stage in the processing of the article in accordance with the method of the invention.

After the discontinuous palladium layer 12 is deposited on the substrate, a 1,000 to 5,000 angstrom thick continuous layer of gold is deposited in any suitable manner over the discontinuous palladium layer 12 (FIG. 4). The resulting article is then sintered to form the unitary structure shown in FIG. 6, in which the substrate has an overlying composite intermediate layer of palladium 12 and gold 13 bonded thereto.

Figure 7:
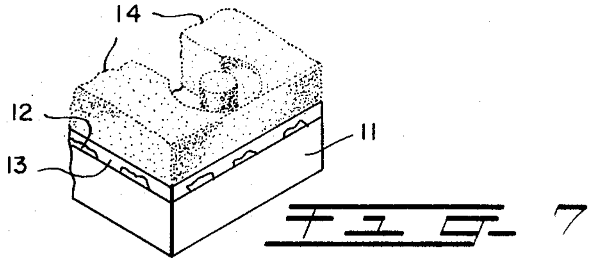
FIG. 7 is a perspective view of a segment of FIG. 6, illustrating a still later stage in the process.

A plating resist such as photoresist or silk-screen printed resist 14 is then applied and patterned as shown in FIG. 7.

Figure 8:
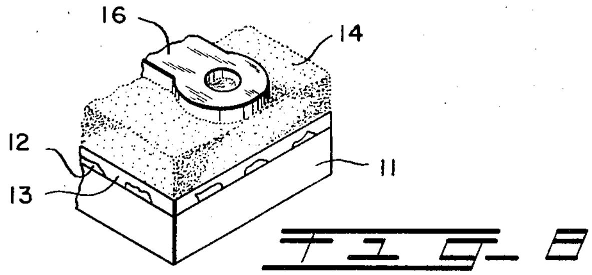
FIG. 8 is a similar view to that of FIG. 7, illustrating a further stage in the process.

A circuit pattern 16 (e.g., of copper, FIG. 8) is then deposited on the composite intermediate layer by any suitable technique such as electroplating. The resulting article includes an overlying circuit pattern of copper which is bonded to the underlying composite gold-palladium intermediate layer and has uncoated or exposed areas of the composite intermediate layer which are not covered by the circuit pattern.

The plating resist is then removed by the use of a suitable solvent.

The article is next immersed in a conventional etching solution such as a 73.6% aqueous solution of potassium tri-iodide to etch the uncoated or exposed areas of the composite intermediate layer from the substrate. Because of the unique nature of the discontinuous palladium layer of the composite intermediate layer in accordance with the invention, the uncoated or exposed composite intermediate layer is etched from the substrate without deleterious damage to the copper circuit pattern.

Figure 9:
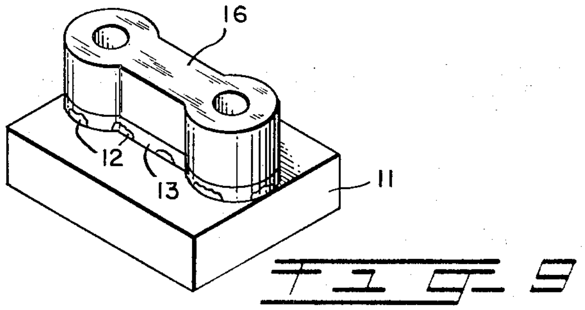
FIG. 9 is a similar view to that of FIG. 6, illustrating the finished article of the invention.

The completed composite conductor shown in FIG. 9 is a layered, tenaciously bonded structure including, in succession (1) the ceramic substrate 11; (2) the patterned composite intermediate layer including the discontinuous palladium layer 12 and the overlying gold layer 13; and (3) the copper circuit pattern 16 which is tenaciously bonded to the substrate by the composite intermediate layer.

Without limiting the generality of the foregoing description, the following examples are presented to illustrate the properties obtainable with the method of the invention, as compared to conventional techniques.

EXAMPLE 1

A series of ceramic substrates composed of 96% alumina and measuring 1" x 1" x 0.025" were sensitized by immersion of a 3% stannous chloride solution ($SnCl_2$) at room temperature for 3 minutes. Each substrate was rinsed in water and next immersed in 0.01% aqueous solution of palladium chloride ($PdCl_2$) at room temperature for an additional 3 minutes to deposit the required discontinuous palladium layer. Each substrate was again rinsed in water and air dried.

Next, a continuous gold layer was deposited on each discontinuous palladium layer in a manner similar to that disclosed in U.S. Patent 3,207,838. In this method, aqueous gold chloride ($AuCl_3$) was reacted with alphapinen mercaptan to produce gold resinate. For each substrate, twenty grams of the resinate was dissolved in the following solvent according to the method disclosed in U.S. Patent 3,207,838:

| | Grams |
|---|---|
| Nitrotoluene | 20 |
| Methyl salicylate | 12 |
| Anethole | 7 |
| Benzyl alcohol | 10 |

The resulting liquid was applied as a coating (e.g., by painting) onto the entire surface of the palladium treated substrate. Each coated substrate was then fired at a temperature in the range of 420° to 670° C. for 15 minutes according to the method of the McCormack patent. The resultant gold film had a thickness in the range of 1,000 to 5,000 angstroms.

Each gold layer was coated with a photoresist in a well-known manner. The photoresist was exposed through a suitable mask in a pattern of exposure that was the negative of the desired pattern and then developed.

Copper metal was then electroplated onto the exposed areas of the gold layer, an aqueous bath of copper pyrosulphate ($Cu_2P_2O_7$) and ammonium hydroxide ($NH_4OH$)

in a conventional manner. The electroplating was continued until the copper film reached a thickness of 0.001 inch.

The photoresist was then dissolved employing a conventional stripper solution, leaving the exposed copper circuit pattern and the gold-palladium composite intermediate layer bonded to the substrate.

The resulting article was then immersed in the following concentrated etching solution and agitated at approximately 30° C. for a period between 15 and 30 seconds:

| | Grams |
|---|---|
| Iodine | 165 |
| Potassium iodide (KI) | 113 |
| Water | 100 |

Upon removal of the composite from the solution, examination revealed that the areas where the adhesive film had been directly exposed to the solution were now bare alumina, as the composite gold and underlying palladium film had been removed by the etching. In the remaining areas where the overlying copper was exposed, no deleterious damage to the circuit pattern occurred, and the copper circuit pattern and the underlying gold and palladium intermediate layer remained bonded to the substrate.

The copper pattern was firmly bonded to the substrate via the gold and palladium composite intermediate layer and could not be pulled from the substrate with 700 pounds of force per square inch of copper surface.

EXAMPLE 2

The procedure of Example 1 was followed, except that a ceramic substrate consisting principally of forsterite was substituted for the substantially alumina substrate.

A force of 700 pounds per square inch of copper surface would not pull the pattern from the forsterite surface when the procedure was completed.

EXAMPLE 3

The procedure of Example 1 was again followed, except that nickel plating to a thickness of 0.001 inch was substituted for the copper plating on the substrate to produce the conductive pattern.

The following etching solution, commonly known as aqua regia, was substituted for the solution of FIG. 1 when immersing the nickel plated substrate:

| | Parts by volume |
|---|---|
| Conc. hydrochloric acid (HCL) | 3 |
| Conc. nitric acid ($HNO_3$) | 1 |

A force of 800 pounds per square inch of nickel surface could not pull the nickel pattern from the substrate when the procedure was completed.

EXAMPLE 4

The procedure of Example 1 was again followed except that the palladium treatment step was omitted in the process.

This time, the copper pattern could be pulled from the substrate surface with a force of 300 pounds per square inch of copper surface.

EXAMPLE 5

The procedure of Example 1 was again followed except that the application of the gold layer in the process was omitted.

The copper pattern could not be electroplated onto the substrate, because the palladium was nonconductive.

These results indicate that the gold layer or other conductive layer is necessary when it is desired to deposit the circuit pattern by electroplating techniques unless of course electroless electroplating is employed.

What is claimed is:

1. An improved method for fabricating a circuit on a substrate wherein the circuit pattern is tenaciously bonded to the substrate, which comprises the steps of:
- immersing the substrate in a solution of palladium for a period of time only to permit a discontinuous layer of the solution to form on the substrate;
- depositing a continuous layer of gold over the discontinuous palladium layer so as to form a composite intermediate layer which is etchable and is tenaciously bonded to the substrate;
- forming a conductive pattern of a different metal on the composite intermediate layer; and
- removing exposed areas of the composite intermediate layer of palladium and gold to fabricate the circuit pattern which is tenaciously bonded via the remaining underlying composite intermediate layer to the substrate.

2. The method of claim 1 wherein said conductive pattern is copper.

3. The method of claim 1 wherein said conductive pattern is nickel.

4. The method of claim 1 wherein said substrate is ceramic.

5. The method of claim 4 wherein said discontinuous palladium layer is deposited by immersing said ceramic substrate in a 0.01% aqueous solution of palladium chloride for not less than 2½ minutes nor more than 3½ minutes.

6. The method of claim 4 wherein said discontinuous palladium layer is deposited by immersing said ceramic substrate in a palladium salt solution for an immersion time not greater than that required to reduce the sheet resistance of the ceramic substrate to $10^6$ ohms per square and not less than that required to begin to reduce the sheet resistance of the ceramic substrate.

7. The method of claim 6 wherein said conductive pattern is nickel.

8. The method of claim 6 wherein said ceramic substrate is alumina.

9. The method of claim 6 wherein said palladium salt solution is an aqueous solution of palladium chloride.

10. The method of claim 6 wherein said conductive pattern is copper.

11. The method of claim 4 wherein said discontinuous palladium layer is deposited by immersing said ceramic substrate in a 0.01% aqueous solution of palladium chloride for a time interval greater than 2 minutes and less than 5 minutes.

12. The method of claim 11 wherein said conductive pattern is copper.

13. The method of claim 11 wherein said ceramic substrate is alumina.

14. The method of claim 11 wherein said conductive pattern is nickel.

15. The method of claim 4 wherein said discontinuous palladium layer is deposited by immersing said ceramic substrate in a palladium salt solution for an immersion time sufficient to reduce the sheet resistance of said ceramic substrate to approximately one megohm per square.

16. The method of claim 15 wherein said conductive pattern is a 0.001 inch thick nickel layer.

17. The method of claim 15 wherein said conductive pattern is a 0.001 inch thick copper layer.

18. The method of claim 15 wherein said conductive pattern is nickel.

19. The method of claim 15 wherein said continuous gold layer is 1,000 to 5,000 angstroms thick.

20. The method of claim 15 wherein said palladium salt solution is an aqueous solution of palladium chloride.

21. The method of claim 20 wherein said conductive pattern is a 0.001 inch thick nickel layer.

22. The method of claim 20 wherein said conductive pattern is a 0.001 inch thick copper layer.

23. The method of claim 15 wherein said ceramic substrate is alumina.

24. The method of claim 21 wherein said alumina substrate is sensitized by immersion in a 3% aqueous solution of stannous chloride.

25. The method of claim 15 wherein said conductive pattern is copper.

26. The method of claim 25 wherein said exposed areas of the intermediate layer of palladium and gold is removed by etching with a concentrated aqueous solution of potassium tri-iodide.

27. The method of claim 25 wherein said ceramic substrate is alumina.

References Cited

UNITED STATES PATENTS

| | | | |
|---|---|---|---|
| 3,105,772 | 10/1963 | Loiseleur | 117—213 X |
| 3,448,349 | 6/1969 | Sumner | 117—212 X |
| 3,288,639 | 11/1966 | Smith, Jr. | 117—213 |
| 3,239,374 | 3/1966 | Ames et al. | 117—212 |
| 3,573,973 | 4/1971 | Drotar | 117—47 X |

RALPH S. KENDALL, Primary Examiner

C. WESTON, Assistant Examiner

U.S. Cl. X.R.

117—47 A, 213, 217